(12) United States Patent
Duerig et al.

(10) Patent No.: US 9,881,760 B2
(45) Date of Patent: Jan. 30, 2018

(54) ELECTROMECHANICAL SWITCHING DEVICE WITH ELECTRODES HAVING 2D LAYERED MATERIALS WITH DISTINCT FUNCTIONAL AREAS

(71) Applicant: International Business Machines Corporation, Armonk, NY (US)

(72) Inventors: Urs T. Duerig, Rueschlikon (CH);
Armin W. Knoll, Rueschlikon (CH);
Elad Koren, Rueschlikon (CH);
Emanuel Loertscher, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/433,554

(22) Filed: Feb. 15, 2017

(65) Prior Publication Data

US 2017/0162355 A1 Jun. 8, 2017

Related U.S. Application Data

(62) Division of application No. 14/827,520, filed on Aug. 17, 2015, now Pat. No. 9,643,839.

(30) Foreign Application Priority Data

Aug. 20, 2014 (GB) .................................. 1414811.8

(51) Int. Cl.
*H01C 10/38* (2006.01)
*H01H 59/00* (2006.01)
(Continued)

(52) U.S. Cl.
CPC ....... *H01H 59/0009* (2013.01); *B81B 3/0021* (2013.01); *H01H 55/00* (2013.01);
(Continued)

(58) Field of Classification Search
CPC .................................. H01C 13/02; H01C 10/38
See application file for complete search history.

(56) References Cited

U.S. PATENT DOCUMENTS 1,470,758 A * 10/1923 Little ..................... H01C 1/148
29/621
2,343,425 A * 3/1944 Smith .................... H01C 10/38
338/126
(Continued)

OTHER PUBLICATIONS

List of IBM Patents or Patent Applications Treated As Related (Appendix P); Filed Feb. 15, 2017, 2 pages.
(Continued)

*Primary Examiner* — Alexander Talpalatski
(74) *Attorney, Agent, or Firm* — Cantor Colburn LLP; Keivan Razavi

(57) ABSTRACT

An electromechanical switching device includes a first electrode, comprising layers of a first 2D layered material, which layers exhibit a first surface; a second electrode, comprising layers of a second 2D layered material, which layers exhibit a second surface opposite the first surface; and an actuation mechanism; wherein each of the first and second 2D layered materials has an anisotropic electrical conductivity, which is lower transversely to its layers than in-plane with the layers; the first electrode includes two distinct areas alongside the first surface, which areas differ in at least one structural, electrical and/or magnetic property; and at least one of the first and second electrodes is actuatable by the actuation mechanism, such that actuation thereof for modification of an electrical conductance transverse to each of the first surface and the second surface to enable current modulation between the first electrode and the second electrode.

20 Claims, 4 Drawing Sheets

(51) Int. Cl.
  *B81B 3/00* (2006.01)
  *H01L 41/09* (2006.01)
  *H01L 41/047* (2006.01)
  *H01H 57/00* (2006.01)
  *H01H 61/01* (2006.01)
  *H01H 55/00* (2006.01)
  *H01H 61/00* (2006.01)

(52) U.S. Cl.
  CPC ............ *H01H 57/00* (2013.01); *H01H 61/01* (2013.01); *H01L 41/0478* (2013.01); *H01L 41/09* (2013.01); *B81B 2201/01* (2013.01); *B81B 2203/04* (2013.01); *H01H 2057/006* (2013.01); *H01H 2061/006* (2013.01)

(56) References Cited

U.S. PATENT DOCUMENTS

| | | | | |
|---|---|---|---|---|
| 3,343,115 A * | 9/1967 | Greenwood | ............ | H01C 10/30 338/174 |
| 3,679,967 A * | 7/1972 | Staker | ............ | B23Q 15/10 323/233 |
| 3,723,938 A * | 3/1973 | Gramm | ............ | H01C 10/04 338/162 |
| 4,237,442 A * | 12/1980 | Carter | ............ | H01C 1/142 338/138 |
| 4,430,635 A * | 2/1984 | Sacchetti | ............ | H01C 10/30 200/269 |
| 4,500,866 A * | 2/1985 | Romann | ............ | F02D 41/182 338/126 |
| 4,694,272 A * | 9/1987 | Maisch | ............ | H01C 10/04 338/138 |
| 4,695,819 A * | 9/1987 | Bowsher | ............ | B60T 7/06 338/153 |
| 5,291,176 A * | 3/1994 | Fujita | ............ | H01C 10/16 338/125 |
| 6,094,116 A * | 7/2000 | Tai | ............ | H01H 50/005 200/181 |
| 6,127,908 A * | 10/2000 | Bozler | ............ | B81B 3/0021 330/66 |
| 6,191,671 B1 * | 2/2001 | Schlaak | ............ | H01H 59/0009 200/181 |
| 7,675,393 B2 * | 3/2010 | Kawakubo | ............ | H01H 1/50 200/181 |
| 8,810,341 B2 * | 8/2014 | Bachman | ............ | H01H 59/0009 200/181 |
| 9,070,578 B2 * | 6/2015 | Despont | ............ | B81B 3/0021 |
| 2004/0041686 A1 * | 3/2004 | Meyer | ............ | H01C 10/305 338/160 |
| 2009/0206979 A1 * | 8/2009 | Tepper | ............ | H01C 10/16 338/115 |
| 2013/0063319 A1 * | 3/2013 | Snyder, Jr. | ............ | H02N 2/046 343/745 |
| 2013/0314203 A1 * | 11/2013 | Kim | ............ | H01C 10/30 338/160 |
| 2016/0056003 A1 | 2/2016 | Duerig et al. | | |
| 2016/0148770 A1 * | 5/2016 | Duerig | ............ | B81B 3/0021 200/181 |

OTHER PUBLICATIONS

Urs T. Duerig, et al. "Electromechanical Switching Device With Electrodes Having 2D Layered Materials With Distinct Functional Areas" U.S. Appl. No. 15,485,835, filed Apr. 12, 2017.

* cited by examiner

ELECTROMECHANICAL SWITCHING DEVICE WITH ELECTRODES HAVING 2D LAYERED MATERIALS WITH DISTINCT FUNCTIONAL AREAS

DOMESTIC AND FOREIGN PRIORITY

This application is a divisional of co-pending U.S. patent application Ser. No. 14/827,520 filed Aug. 17, 2015; which claims priority to Great Britain Patent Application No. 1414811.8, filed Aug. 20, 2014, and all the benefits accruing therefrom under 35 U.S.C. §119, the contents of which in its entirety are herein incorporated by reference.

BACKGROUND

The invention relates in general to the field of electromechanical switching devices, in particular to micro- and nano-electromechanical switching devices.

In electronic circuits, electrical signals need to be switched between "off" and "on" states to perform logic operations or to store information. Ideal switching properties (i.e., very abrupt switching transition and a high on/off ratio, e.g., >$10^{10}$) of electromechanical relays are not achieved with current miniaturized CMOS-based transistors (whose typical on/off ratios for the electrical resistance are on the order of $10^2$-$10^6$ and changes require some 100 mV in bias). More recent concepts of switching devices allow to achieve more abrupt switching, but they usually suffer from low "on" currents (e.g., <10 µA for tunneling transistors) or too large device dimensions (e.g., MEMS switch), which prevent many logic or memory applications.

SUMMARY

In one embodiment, an electromechanical switching device includes a first electrode, comprising layers of a first 2D layered material, which layers exhibit a first surface; a second electrode, comprising layers of a second 2D layered material, which layers exhibit a second surface opposite the first surface; and an actuation mechanism; wherein each of the first and second 2D layered materials has an anisotropic electrical conductivity, which is lower transversely to its layers than in-plane with the layers; the first electrode includes two distinct areas alongside the first surface, which areas differ in at least one structural, electrical and/or magnetic property; and at least one of the first and second electrodes is actuatable by the actuation mechanism, such that actuation thereof for modification of an electrical conductance transverse to each of the first surface and the second surface to enable current modulation between the first electrode and the second electrode.

In another embodiment, a method of operating an electromechanical switching device includes actuating, via an actuation mechanism, at least one of a first electrode and a second electrode; the first electrode comprising layers of a first 2D layered material, which layers exhibit a first surface; the second electrode comprising layers of a second 2D layered material, which layers exhibit a second surface opposite the first surface; and wherein each of the first and second 2D layered materials has an anisotropic electrical conductivity, which is lower transversely to its layers than in-plane with the layers; the first electrode comprising two distinct areas alongside the first surface, which areas differ in at least one structural, electrical and/or magnetic property; and wherein actuation of at least one of the first electrode and the second electrode modifies an electrical conductance transverse to each of the first surface and the second surface to enable current modulation between the first electrode and the second electrode.

BRIEF DESCRIPTION OF THE DRAWINGS

FIG. 2 (right) is a graph showing curves that represent the resulting devices resistances (non-linear, non-parabolic), as a function of the offset O between the stacked electrodes;

DETAILED DESCRIPTION

Figure 1:
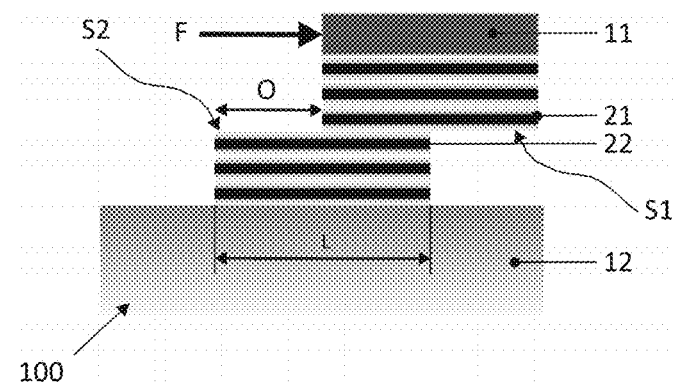
FIG. 1 is a 2D (cross-sectional) view of a simplified representation of a switching device according to a first class of embodiments.

According to a first aspect, the present invention is embodied as an electromechanical switching device including a first electrode having layers of a first 2D layered material, which layers exhibit a first surface; and a second electrode having layers of a second 2D layered material, which layers exhibit a second surface opposite the first surface; and an actuation mechanism, wherein each of the first and second 2D layered materials has an anisotropic electrical conductivity, which is lower transversely to its layers than in-plane with the layers; the first electrode includes two distinct areas alongside the first surface, which areas differ in at least one structural, electrical and/or magnetic property; and at least one of the two electrodes is actuatable by the actuation mechanism, such that actuation thereof allows to modify an electrical conductance transverse to each of the first surface and the second surface to enable current modulation between the first electrode and the second electrode.

In embodiments, the actuatable electrode is movable by the actuation mechanism, such that the first and second surfaces are movable parallel to each other upon actuation by the actuation mechanism.

In a first class of embodiment, one (at least) of the electrodes, e.g., the first electrode, is structured in-plane with the first surface, such as to exhibit distinct portions, each forming one of the distinct areas, wherein, preferably, the in-plane profile of the first electrode essentially forms a concave polygon.

In a second class of embodiments, one (at least) of the electrodes, e.g., the first electrode, is structured transversely to the first surface, such as to exhibit two or more structures transversal to the first surface, each of the two or more transversal structures forming one of the distinct areas. Preferred embodiments of the second class may comprise one or more of the following features: the two or more transversal structures are electrically insulated from each other; at least two of the transversal structures extend up to the first surface, wherein the first electrode includes two subsets of layers of 2D layered material, which subsets each exhibit respective surface portions that are opposite to the second surface; the two or more transversal structures of (any of) the first electrode(s) have different dimensions.

In abacus-types of embodiments, the device includes one or more additional pairs of electrodes, to form a set of first electrodes opposite to second electrodes, wherein the first electrodes are mechanically coupled, such as to be actionable by the actuation mechanism, and wherein, preferably, the first electrodes are coupled via an electrically insulating coupling structure, and wherein, more preferably, the distinct areas of the first electrodes differ.

In a third class of embodiments, the distinct areas are respectively formed by distinct magnetic domains, the second electrode comprising one or more magnetic domains, each being substantially aligned with a magnetic domain corresponding to a respective one of the two distinct areas.

In embodiments, any or each of the 2D layered materials of the above devices includes one of: graphene, graphitic layers, BN, $MoS_2$, $WS_2$, $MoSe_2$, $NbSe_2$, $NbS_2$, $NbTe_2$, $TaS_2$, $TaSe_2$, $TaTe_2$ or $TiSe_2$. In preferred embodiments, each of the 2D layered materials consist of a same 2D layered material.

Preferably, the actuation mechanism includes one or any combination of: an electrostatic mechanism; a piezoelectric mechanism; a thermal deformation mechanism; a material stress-induced mechanism or a magnetic mechanism.

According to another aspect, the invention is embodied as a method of operating an electromechanical switching device, including providing the electromechanical switching device according to any one of the above embodiments; and actuating the actuatable electrode via the actuation mechanism.

In embodiments, actuating the actuatable electrode includes moving the actuatable electrode to modify an overlap between the first surface and the second surface, to impact the electrical conductance of the electrodes transverse to each of the first surface and the second surface and thereby obtain current modulation between the first electrode and the second electrode.

Preferably, the first electrode of includes two subsets of layers of 2D layered material, which subsets exhibit, each, respective surface portions that are, each, opposite to the second surface, and the step of moving the actuatable electrode results in modifying an overlap between the surface portions and the second surface.

Devices and methods embodying the present invention will now be described, by way of non-limiting examples, and in reference to the accompanying drawings. Technical features depicted in the drawings are not necessarily to scale.

In the following, detailed embodiments of novel electromechanical switching devices are described, which can be scaled down to a few nanometers, both laterally and transversally, while enabling suitable switching properties.

A general aspect of the invention is first described in reference to FIGS. 1-7, which concerns an electromechanical switching device 100. Basically, this device includes two electrodes and an actuation mechanism F.

The first electrode 11, 21 includes layers 21 of a first 2D layered material, which layers 21 exhibit a first surface S1. The second electrode 12, 22 includes layers 22 of a second 2D layered material, which layers exhibit a second surface S2 opposite to the first surface S1. Each of the first and second 2D layered materials 21, 22 has an anisotropic electrical conductivity, i.e., the transversal component of the electrical conductivity (transversely to the layers of the 2D material) is smaller, and typically much smaller, than the in-plane component.

The first electrode (i.e., the upper electrode in the drawings) includes two distinct areas alongside the first surface S1. As to be explained later in details, these areas differ in at least one structural, electrical and/or magnetic property.

Finally, at least one of the two electrodes is actuatable by the actuation mechanism F. Several types of designs can be contemplated for the actuation mechanism but, most generally, this mechanism is coupled to one (or possibly each) of the electrodes and configured to actuate the coupled electrode(s). Actuation of the electrode(s) may notably allow to modify the distance between the first surface S1 and the second surface S2 or to strain (or, more generally, to condition) the electrode(s). This, as will be seen, allows the electrical conductance transversely to each of the first surface and the second surface to be modified, thanks to the distinct areas provided in the first electrode. As a result, actuation of the electrode(s) enables current modulation between the first and second electrodes. As discussed later in detail, the distinct areas can be suitably designed to obtain the desired current modulation and, in turn, the desired device functionality.

Note that, beyond the sole first electrode, each of the first and second electrodes may be provided with distinct areas, especially where magnetic properties of the areas are relied upon. Furthermore, and as implicit from the above description, the actuatable electrode needs not necessarily be the first electrode. Any one or each of the electrodes can be mounted actuatable in the device and be actuated to obtain the desired effect. For completeness, note that, although one electrode (at least) needs be actuated, it does not necessarily need to be moved, especially when seeking to exploit different magnetic properties of the distinct areas. It can, for instance, simply be strained. In variants, electrodes (or electrodes' bodies) can be both strained and/or moved. For completeness, electrodes may for instance be linearly or rotatably moved with respect to each other, if necessary.

Typically, each electrode further includes a body 11, 12, e.g., deposited on top of the 2D layered material 21, 22. Note that the body of an electrode may directly influence properties of the attached 2D layered material, e.g., strain, electronic and/or magnetic properties of the latter.

Thus, a core idea underlying the invention is to exploit the distinct areas of one (or each) of the electrodes to modify the transverse electrical conductance, upon actuation of the electrode(s). As known per se, the conductance refers to a property of the device (here the device including the two electrodes), whereas the conductivity is a property of the materials at stake. So, the conductance depends on the dimensions of the conductor and its conductivity, whereas the conductivity does not depend on its dimensions. In present embodiments, the 2D materials involved have anisotropic electrical conductivities. Now, when actuating the electrodes, the distinct areas on one (or even each) of the electrodes interact differently with the opposite electrode, such that the electrical conductance of the electrodes will change, e.g. non-linearly, upon actuation of the electrode(s).

The invention can be embodied by way of devices, as described above, or still as methods of operating such devices. Most basically, such methods revolve around actuating the actuatable electrode(s), via the actuation mechanism, to obtain the desired switching effect.

Figure 2:
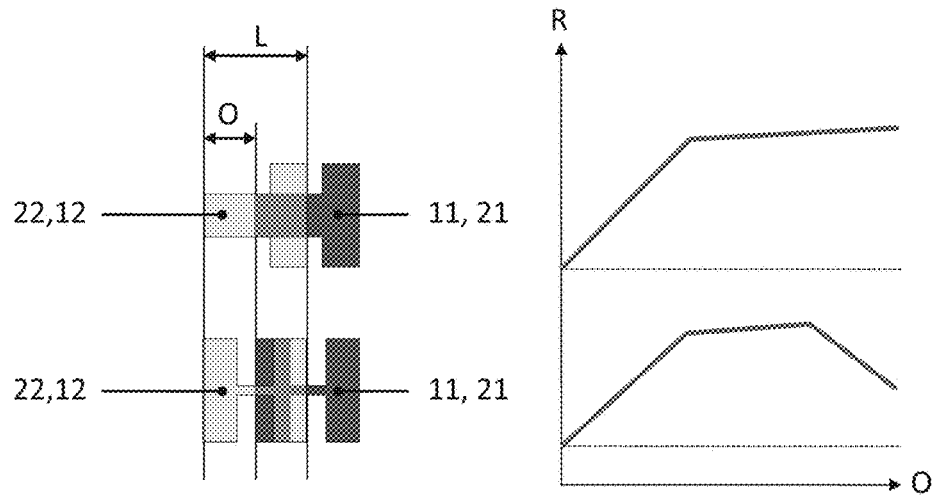
FIG. 2 (left) is a top view of a simplified representation of the electrodes of switching devices such as illustrated in FIG. 1, showing two possible variants of structured profiles for these electrodes.
Figure 3:
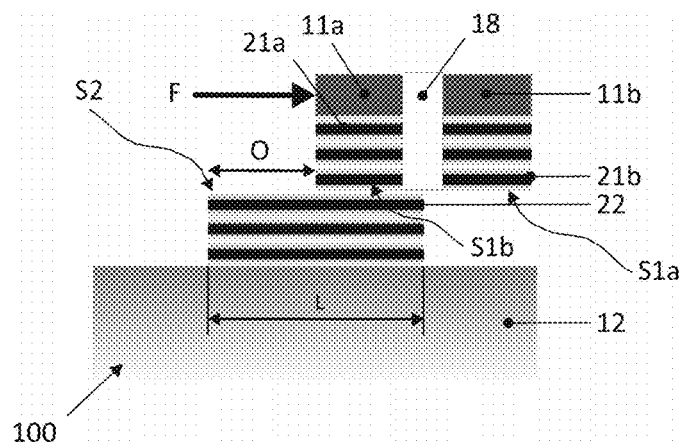
FIG. 3 is a 2D (cross-sectional) view of a simplified representation of a switching device according to a second class of embodiments, wherein the upper electrode stack (i.e., both the electrode body and the 2D layer material) is transversally structured, and subsets of this upper electrode are electrically insulated from each other.

Three main classes of embodiments can be contemplated. A first class is one where one (at least) of the electrodes is structured parallel to the functional surfaces S1, S2, as illustrated in FIGS. 1 and 2. The second class of embodiments concerns electrodes that are structured transversally to the first and second surface, such as to provide transversal substructures, as illustrated in FIGS. 3-7. The third class of embodiments makes use of areas that are prepared such as to exhibit distinct magnetic domains. In each of these, the two (or more) distinct areas provided in one (or even each) of the electrodes allows to modify the transverse electrical conductance, when actuating one (or each of) the electrodes. These three classes of embodiments are now described in detail.

First Class of Embodiments: In-Plane Structured Electrode(s)

As exemplified in FIG. 2, the first class of embodiments encompasses electrodes structured parallel to the first and second surfaces, such as to exhibit a profile in-plane. As seen in FIG. 2, the in-plane shape of the upper electrode exhibits distinct portions. Note that both the upper and lower electrodes may be shaped in-plane, although this is not necessary, inasmuch as this is the overlap that matters in the present class of embodiments. Electrodes can notably be given a T-shape (like in the upper figure), an H-shape (lower figure) or, more generally, any shape leading to truly distinct portions, in order to obtain the desired non-linear effect (cf the right-hand graphs), upon actuation. Note that at least a singularity in the observed resistance R (as a function of the offset O between the electrodes) is sought, a thing that is discussed later in more detail. More generally, the shape of the electrode(s) shall exhibit distinct portions, that is, portions that have different structural properties (geometry: dimensions and orientations), and typically delimited by straight edges, where edges delimiting a portion form, each, an angle with an edge of another portion. The profile of the electrode(s), as seen, e.g., from the top, shall accordingly not form a square, a circle or any such convex set; it will rather form a concave, i.e., reentrant polygon (subject to small fabrication defects), like in the examples of FIG. 2. As seen in the right-hand side graphs, the distinct portions lead to a singularity in the observed resistance R (i.e., a broken curve results, meaning that its derivative has a discontinuity at the singular point). Depending on the complexity of the shape chosen, various functional behaviors can be achieved, e.g., (strongly) superlinear, exponential, negative-step, plateau, etc. (as illustrated in the lower right-hand side graph). Now, in addition to their different in-plane shapes, the upper and lower electrodes may be provided with different electrical and/or magnetic properties in this class of embodiment.

Examples of devices such as illustrated in FIGS. 1 and 2 is discussed now in detail. Each electrode shall typically comprise between two and $10^7$ layers of 2D material 21, 22 (e.g., graphene layers or semiconductor layers, which, incidentally, need not stringently be the same to form a heterostructure). The layer-to-layer resistance (or inter-layer, i.e., out-of-plane) resistance, $R_{LL}$, is larger than the intra-layer (i.e., in-plane) resistance $R_{IL}$. Top and bottom electrode's bodies 11, 12 sandwich the 2D stacked layers, establishing electrical and mechanical contact to the stacked layers underneath. These components form a layered stack of conducting layers sandwiched between the bottom electrode body 12 (e.g., a substrate) and the top electrode body 11. The intra-layer resistance, $R_{IL}$, is typically 1000 times smaller than the layer-to-layer resistance, $R_{LL}$.

The mechanical force F exerted by the actuation device acts on the top electrode and moves parts of the upper layer stack relatively to the lower stack, leading to an in-plane offset O. In variants, the force applied by the actuation mechanism may lead to a strain built-up in the structure. The motion takes place at one layer-to-layer interface (FIG. 1), leaving the other electrode 12, 22 in position. In other variants, multiple interfaces can be contemplated, where a cascaded motion of multiple layers' stacks takes place (not shown). Depending on the overlap and the geometry of the layers, the overall trough-layer resistance R (which roughly corresponds to the sum of the $R_{LL}$'s between top and bottom electrodes' bodies 12, 22) is increasing with the increasing offset O as the electronic overlap between the layers is decreasing.

Note that if the in-plane electrode profile were rectangular or squared and if the electrodes would otherwise not include distinct areas as in the present invention, the resulting effective resistance R would increase linearly as a function of the offset O (in the direction of motion parallel to one edge). Other geometries (like circular top electrodes) could achieve a nonlinear functional behavior of the resistance vs. displacement, e.g., a smooth parabola. At variance with such potential realizations, the present embodiments rely on electrode(s) that are tailored to achieve more complex functionality, as depicted in the right-hand side of FIG. 2 (yielding one or more singularities). As explained earlier, the present electrodes comprise distinct areas, e.g., here portions, which have distinct structural properties.

By design of the electrodes, negative resistance slopes can also be achieved, as illustrated in FIG. 2, lower example (H-shaped electrodes).

As to be described next in reference to the second class of embodiments, other electrodes' geometries are possible, notably yielding step-like functionality, i.e., jump discontinuities instead of merely singularities.

Second Class of Embodiments: Transverse Structures

As seen just above, horizontal structuring of the top electrode allows electronic current modulation to be achieved. Now, and as described in detail below, it can be realized that a "vertical" structuring of electrodes allows abrupt switching to be achieved, leading to ideal switching properties. Vertical structuring of insulating layers enables the electrical conductance in-plane of the layers to be completely interrupted (or broken, see FIG. 3).

The second class of embodiments therefore concerns electrodes that are structured transversally to the surfaces S1, S2, such as to provide transversal structures, which form the required distinct areas, as illustrated in FIGS. 3-7. In that case, the actuatable electrode(s) is (are) movable by the actuation mechanism, such that the first and second surfaces S1, S2 are movable parallel to each other. Like in the first class of embodiment, corresponding methods of actuation includes actuating the actuatable electrode(s) such as to move them relatively to each other (to modify an overlap between the first and second surfaces S1, S2), which impacts the electrical conductance of the electrodes transverse to the surfaces S1, S2. One can accordingly obtain current modulation between the first electrode and the second electrode.

In particular, the first electrode can be structured such as to exhibit two or more transversal structures 11a, 21a; 11b, 21b, that are electrically insulated from each other, thanks to, e.g., a separating element 18, 18a. One understands that such devices will have a number of characteristics in common with devices of the first class, except that the first electrode does not necessarily need to be structured in-plane and is instead structured transversally, and may further comprise an insulating element 18, 18a. Such devices can for instance be realized by a two-step structuring process of the top electrode followed by subsequent top-layer separation (oxygen etching) and filling-up by an insulating spacer.

Figure 4:
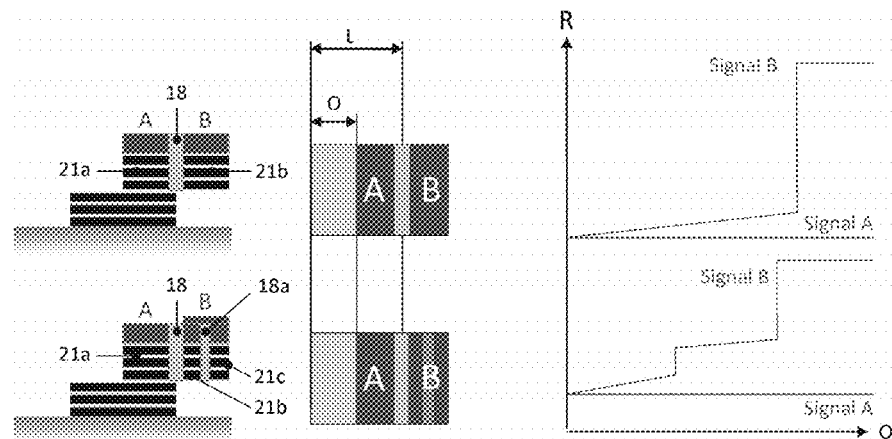
FIG. 4 illustrates two variants of the second class of embodiments (the upper variant corresponding to that of FIG. 3), and respectively shows (from left to right): a simplified representation (side view) of a switching device; a top view of the electrodes; and the corresponding resistance signals as a function of the offset between upper and lower electrodes of each device.
Figure 5:
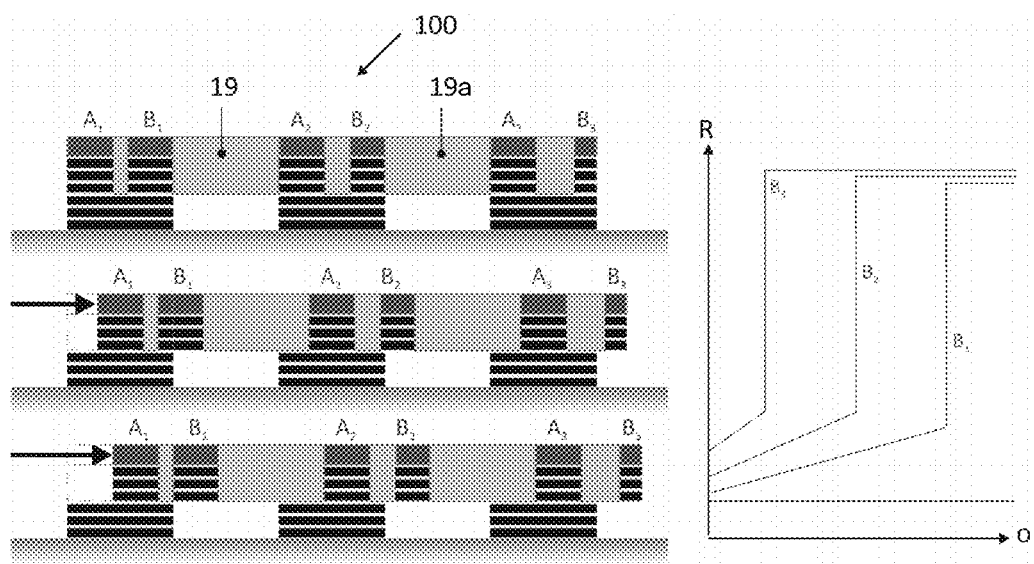
FIG. 5 shows 2D views of a more complex switching device, in an abacus-type of configuration, depicting the actuation of rigidly coupled electrodes, as well as the corresponding resistance signals, according to the second class of embodiments.

Using insulated structures 21a-c allows a structured electrical operation diagram to be obtained and, in particular, step-like variations in the resistance R to be created as a function of the electrode offset O, as illustrated in FIGS. 4 and 5. Note that the insulating element(s) 18, 18a could be empty (air) but this would cause difficulties when actuating the electrode, especially where a constant separation distance is sought. So, the vertical element 18, 18a is rather made of an insulator material, which rigidly connects the two subunits, such that it is possible to move the first (upper) electrode's substructures integrally and simultaneously.

The switching mechanism is the following. If the layers are structured vertically and electrically insulated, then the intra-layer electrical conductance is broken. Sliding of the upper layer stack relatively to the lower stack leads first to a monotonous, linear increase in resistance, as the overlap is reduced and as it is seen in the right hand side (upper) graph of FIG. 4. If the segment "B" is moved over the edge of the lower layer stack, it becomes suddenly electrically decoupled (due to the air gap) from the transport path previously established between the top and bottom electrodes. As a result, the resistance of path B becomes "infinitely" large (or more exactly, the resistance, which is essentially defined by the air-gap tunneling to the bottom electrode, increases exponentially with the air-gap distance). This yields a very abrupt and distinct switching, as seen in FIG. 4, with high "on"/"off" ratios, typically in the order of at least $10^6$.

The operation of such a device and the design of the current modulation will further be greatly facilitated if the end surfaces of the transversal structures are coplanar, as this makes it possible to easily maintain a constant height of the sliding electrode(s). Thus, in preferred embodiments, at least two of the transversal structures extend up to the first surface S1, i.e., the first electrode exhibits two subsets of layers 21a, 21b of 2D layered materials, which subsets exhibit, each, respective surface portions S1a, S1b, opposite to the second surface S2. Moving the actuatable electrode(s) relatively to each other shall, in that case, result in modifying an overlap between the surface portions S1a, S1b and the second surface S2.

Note that the transversal structures may or may not have different electrical properties (e.g., they may have distinct electrical conductivities).

Referring now to FIG. 4 (lower row) or 5, in embodiments, the switching device may comprise two or more transversal structures (in the first or upper electrode) that have different dimensions, e.g., to provide distinct overlap with the lower electrode's exposed surface, for the same reasons as already explained above. This will be especially advantageous in abacus-types of embodiments, FIG. 5. In the lower example of FIG. 4, a multi-level switching is further achieved by fine-structuring of the sliding electrode, in particular the component "B", which includes two subsegments (or substructures), forming vertical legs.

In other words, fine structuring of the top electrode can be done, a thing that can be leveraged to improve the program switching functionality. For instance, as exemplified in FIG. 4 (lower row), the subsegments (or vertical legs) in the structure B can be mechanically coupled, to move various substructures simultaneously with distinct individual overlaps. The subsegments are not electrically coupled.

Depending on the thickness of the lower layer stack and the air-gap (typically of several nm's), the electrical decoupling may typically result in resistances of more than 1 TΩ. In comparison, the initial resistance of the transverse substructure, when connected directly to the bottom electrode, is on the order of a few tenths of Ohms (depending on the area and the layer coupling). Thus, "on"/"off" ratios of more than $10^{11}$ can be achieved. For ultrathin layers, e.g. double layers of graphene, the "off" resistance can be increased by adding an additional high-k insulating layer to the bottom electrode, embedding the lower layer part and establishing a barrier for electrons to tunnel in free space. As the resistance of the initial state is low (e.g., about 10 Ohms for graphene), not only high "on"/"off" ratios but also reasonably high "on" currents can be achieved.

In reference to FIG. 5, more complex ("abacus") devices can be realized, which includes one or more additional pairs of electrodes, wherein each pair has a configuration comparable to the pair formed by the "first electrode" and the "second electrode" discussed so far. I.e., abacus-types of embodiments mechanically couple a subset of electrodes. Formally, such devices comprise a set of "first" electrodes opposite to the "second" electrodes. For instance, the first (upper) electrodes may be mechanically, coupled, such as to be integrally actionable by one and a same actuation mechanism. As illustrated in FIG. 5, the upper set of electrodes may be rigidly coupled (mechanically) via coupling structures 19, 19a, which are electrically insulating. Structures 19, 19a may for instance comprise horizontal parts and essentially extend parallel to the first surface S1. Thus, such a complex switching device includes two or more pairs of electrodes, instead of one, as described so far. That is, each pair has a similar configuration as the pair of electrodes as discussed in reference to FIG. 3 or 4, although electrodes may be actuated by one and a same actuation mechanism. Rigidly coupling the subset of actuatable electrodes allows for integral actuation thereof.

As illustrated in FIG. 5, the distinct areas of each of the upper electrodes (the "first" electrodes) differ, from one electrode to the other, as denoted by distinct references $A_i$, $B_i$ (i=1 to 3), the distinct areas are provided by distinct transverse structures in this example. Thus, abacus-types of operation make it possible to couple individual subsegments with distinct functionalities, to achieve a higher-order property, depending on the actual wiring and the overlap-displacement relationship of the individual sub segment. For example, the separation event occurs at different offsets for every sub segment, as illustrated in FIG. 5, leading to enhanced complexity for programming. Finally, abacus-implementations can be contemplated for each class of embodiments (making use of different in-plane profiled electrodes, or different sets of transverse structures, like in FIG. 5, or still different sets of magnetic domains).

For completeness, it is noted that, in each of the first and second classes of embodiments: the layers of the 2D materials of the first and second electrodes can be moved in-plane, relatively to each other (layer-to-layer offset), or the overlap of the 2D materials can be changed by strain applied to one of the electrodes; each stack of 2D layered material is contacted via top and bottom electrode bodies 11, 12; the electronic coupling of the 2D layers is established via their electronic structure and electronic coupling. The proximity of the layers leads to electronic conduction, whereas separation of the layers leads to a reduction of electronic conduction. The transverse conductivity depends (roughly) exponentially on the transverse distance. Optimal distances can be determined by trial-and-error. One needs to operate the electrodes at a sufficiently close transverse distance, ideally equal to the inter-layer equilibrium distance, but possibly slightly smaller or larger, as long as a satisfactory on/off ratio is obtained. The transverse distance is, ideally, not changed during the electrodes' actuation. For example, in the "off" state a typical gap between the two electrodes is close to 3.5 Å for graphitic layer-to-layer separation.

The current modulation is achieved by a sudden change in the overlap of the layers 21 (21a, 21b) and 22. The way current is modulated as a function of layer separation/offset is primarily defined by the layers' vertical and/or horizontal structuring and their overlap, whereas it primarily depends on the areas' activation, upon actuation, in the third class of embodiment, which is discussed below.

Third Class of Embodiments: Magnetic Domains

Figure 8:
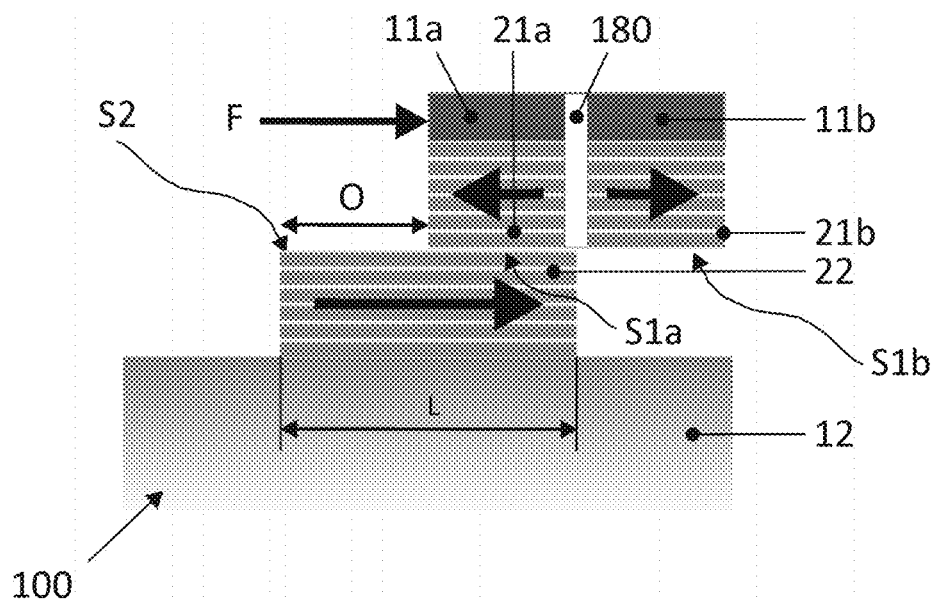
FIGS. 8 and 9 show, each, a 2D (cross-sectional) view of a simplified representation of a switching device according to a third class of embodiments, wherein one or each of the electrodes exhibit magnetic domains.
Figure 9:
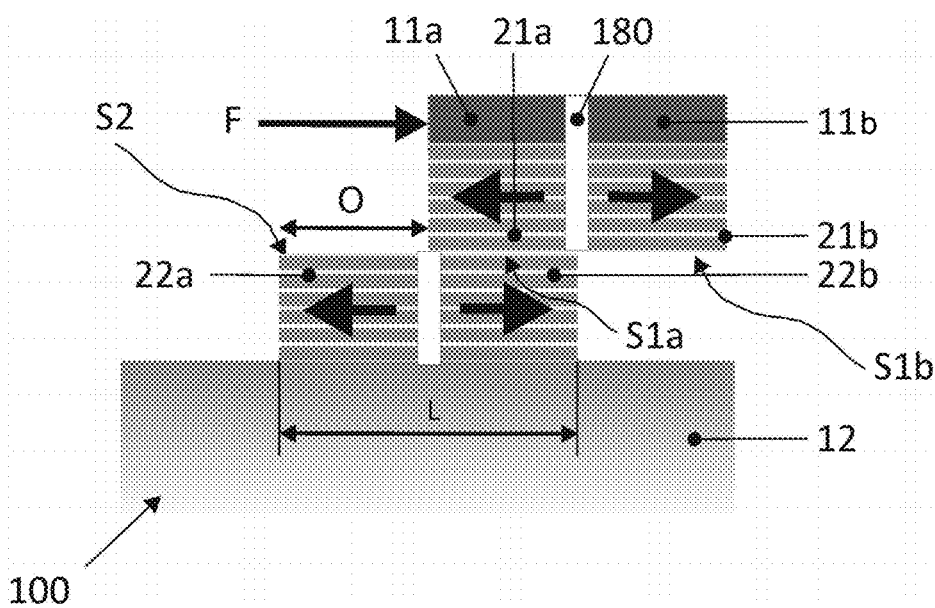

In reference to FIGS. 8 and 9, the third class of embodiments makes use of areas formed by distinct magnetic domains created by suitably actuating the electrode(s). Seen from a side, a device according to this class looks like the device of FIG. 1, except that the upper electrode needs not be structured in-plane. Typically, distinct magnetic domains will be formed in the upper (and possibly in the lower electrode too), to form distinct areas, arranged side-by-side in each electrode and opposite to each other. As it can be realized from electrodynamics, the alignment of magnetic regions in the upper and lower electrodes can influence the way current is conducted through the conductor (here the two electrodes), such that current modulation can be obtained using regions having distinct magnetic properties.

To that aim, distinct areas can be respectively formed by distinct magnetic domains 21a, 21b in the upper (first) electrode, while the lower (second) electrode may comprise one (22) or more (22a, 22b) magnetic domains. Each of the lower magnetic domains is (substantially) aligned with a respective one of the magnetic domains of the upper electrode, as illustrated in FIGS. 8, 9. For example, magnetization in a single, lower magnetic domain 22 can be parallel with the magnetization of one of the upper electrode's domains 21a, 21b, as in FIG. 8. Still, the magnetization of each of the contiguous domains 22a, 22b of the lower electrode could be aligned with a respective one of the two domains 21a, 21b, as illustrated in FIG. 9. In the latter case, the orientations of the lower domains are initially aligned with the orientations in the opposite, upper domains 21a, 21b (initial state is "on"). A huge magnetoresistance effect on the current in transverse direction flowing between top electrodes 21a, 21b and bottom electrode body 12, can be obtained by sliding the top electrode over the lower electrode, as depicted in FIGS. 8 and 9, such that the electrodes in contact have opposite domains. This leads to a final state which is "off".

Corresponding methods of actuation may notably involve straining and/or spatial displacement of the actuatable electrode(s) to obtain the desired modulation. For example, an overlap between two magnetic domains with parallel magnetization can be changed to an overlap between two magnetic domains of opposite magnetizations, with a distinctly higher magnetoresistance. Similarly, magnetic domain orientations can be modulated by strain, leading to above described effects. Using distinctly oriented magnetic domains advantageously leads to huge on/off ratios in the magnetoresistance, typically on the order of 10-100.

The spatial termination of the magnetic domains can be very abrupt, without any additional separation element 180 needed to separate the magnetic domains. Still, distinct portions can be envisioned, separated by interface elements 180, to reinforce the separation between the magnetic domains. In order to electrically separate the electrodes body 11a and 11b, an insulating spacer 180 can be used.

Note that, notwithstanding the three main classes of embodiments discussed above, variants can also be contemplated, where aspects of each of these classes are intermingled. For example, it can be realized that the 2D layers can be vertically and/or horizontally structured. In addition, considerations evoked in respect of the first and second classes also apply to the third class (e.g., electronic coupling of the 2D layers).

All of the present embodiments result in switching devices that can be scaled down to a few nanometers in all directions (the stacked layer material can for instance be composed of only two layers) and provide satisfactory switching properties. In particular, discontinuous or abrupt switching can be obtained, together with the necessary contrast. Note that the primarily observed property (the effective transverse resistance) may vary abruptly (i.e., exhibit a jump discontinuity, as in FIG. 4 or 5) or, at least, exhibit a singularity (FIG. 2). In the latter case, the derivative of the primarily observed property would nevertheless exhibit an infinite slope, like in a step-like function, resulting in an abrupt profile of the derivative property, such that we can still speak of an abrupt switching mechanism in respect of the derivative property. In addition, the proposed switches take advantage of electrical and structural properties inherent to the layer stack material, as well as low adhesion and friction and stiction forces of 2D layered materials. This enables, in turn, predictable transport and mechanical properties.

Furthermore, 2D materials are relatively inert; they can therefore be used for low friction sliding electronics and/or out of plane push/pull for current modulation. As it can be realized, low friction leads to less fatigue and high operational reliability.

More generally, the present switching devices can be regarded as devices providing (very) non-linear properties, typically varying "more abruptly" than a mere parabolic curve. As illustrated in the appended drawings, the obtained resistances shall typically exhibit one or more singularities or discontinuities.

The present embodiments may notably find application in memory circuits, logic devices, sensors, etc. Although the most immediate applications concern fast and abrupt switching and are therefore directly applicable to logic operations, memory operations can be contemplated too, especially when the mechanical force needed to actuate the electrode(s) reveals a hysteretic behavior, due to ambipolar or asymmetric forces, or friction for pulling as opposed to pushing.

2D layered materials are known and largely addressed in the scientific literature. While graphene is the most well-known 2D layered material, other materials, can be contemplated for use in the present invention. In embodiments, the device 100 may involve one or more of the following 2D layered materials (not just for the electrodes): graphene, graphitic layers, BN, $MoS_2$, $WS_2$, $MoSe_2$, $NbSe_2$, $NbS_2$, $NbTe_2$, $TaS_2$, $TaSe_2$, $TaTe_2$ and/or $TiSe_2$. The terminology "2D layered material" is widely used to denote such materials. Layered materials layers can be realized either by Chemical Vapor Deposition (or CVD) growth or by mechanical exfoliation directly on the substrate or by transferring a pre-existing material on to the substrate from a different substrate that was used for the material growth (when the 2D material cannot be grown directly on the desired substrate i.e. $SiO_2$). The number of layers needed can typically be the same as for graphene, namely down to two layers only in the ultimate-scaled case. Each of the 2D layered materials involved at each of the electrodes may comprise a same 2D layered material.

The thicknesses and lateral dimensions of the electrodes or other moving parts possibly involved typically range from a few nm at least one nm to a few μmm, e.g., typically less than 20 μmm and preferably less than 100 μmm. The thickness of the 2D layered materials used in embodiments below can vary from a single layer (less than 1 nm) to hundreds of layers (more than 100 nm), but will typically be in the nanometer range. The "contact" area between the electrodes is typically between 10 nm and 1 micron (1000 nm). Thus, embodiments of the present electromechanical switching devices can be regarded as micro- or nano-scale switching devices. The contact area determines the "on" current, a parameter that can be adapted as needed, depending on the actual application contemplated.

At least some of the embodiments discussed below allow for achieving an on/off ratio on the order of $10^{10}$. The actual ratio will, however, depend on the fundamental properties of the chosen materials and arranged retained for the electrodes.

Most devices described above can be obtained by standard fabrication processes, e.g., by photo or electron-beam lithography. A few layers of graphene or other 2D layered materials may for instance be deposited on top of a bottom electrode, followed by a mask deposition on top of the deposited 2D material layers. The top electrode can then be deposited on top of the 2D material layers, followed by lift off and etch steps. Transversal mechanical coupling elements 19, 19a can be added (to ensure integral mechanical motion), by partial etching, deposition of the insulating spacer material in between the sub segments.

Due to lateral etching (chemical component), the sliding stack is etched further, creating the desired initiator for the sliding between two layers in the stack.

Figure 6:
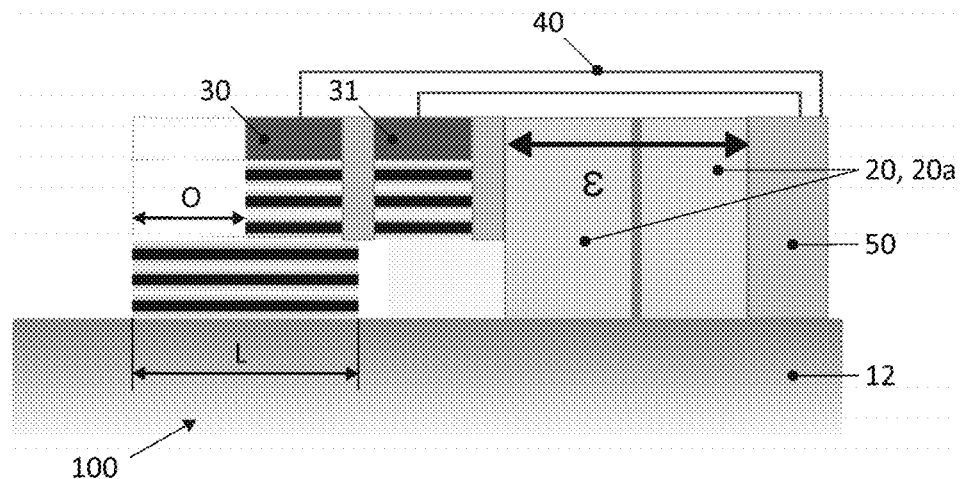
FIGS. 6 and 7 show 2D views of other switching devices having transversally structured electrodes, according to the second class of embodiments, and coupled to electrostatic, piezoelectric or thermal actuation mechanisms.
Figure 7:
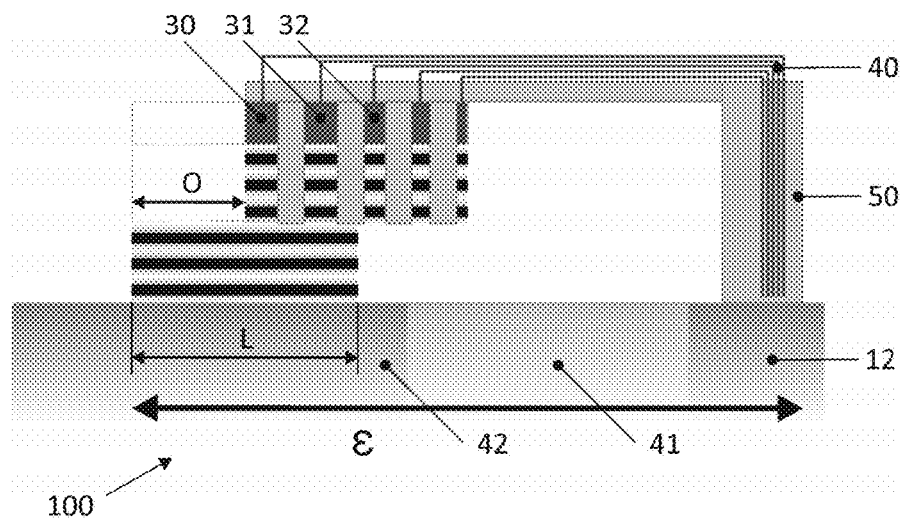

Finally, additional explanations are given in regard of the preferred actuation mechanisms, and in reference to FIGS. 6 and 7. In FIG. 6, the mechanical actuation of the top-electrode is ensured by piezo elements 20, 20a, whereas in FIG. 7, it is ensured by relative motion of substrate which can be induced by mechanical strain, electrostatic or capacitive, thermal expansion, etc.

The exemplary devices shown in FIGS. 6, 7 require a mechanical displacement, i.e., a push-pull force applied to the upper layers with respect to the lower layers. This can be realized by mounting one or more of the top electrodes 30, 31 via one piezo 20 or multiple piezo elements 20, 20a (multiple piezo elements allow larger displacements to be achieved) via a mechanical post 50 to the substrate (bottom electrode's body) 12, as illustrated in FIG. 6. In variants, electrostatic actuation can be used, e.g. with a servo type of system, mounted at positions such as the piezo elements 20, 20a, leading to a relative displacement of the top electrodes with respect to the bottom electrode. The electrical circuit is formed by wiring top electrodes 30, 31 individually 40 or commonly, to the bottom electrode's body 12, depending on the desired functionality. Multiple top electrodes 30, 31, providing different overlaps to the common bottom electrode can be operated jointly using one single actuator 20, 20a.

In addition, the bottom layer can be attenuated, e.g., by straining one section 41 of the substrate 100 (e.g., between section 42 of the bottom electrode's body and the post 50) yielding a relative displacement of the top electrodes with respect to the bottom electrode. Tensile or compressive strain can be induced to section 41 either mechanically or thermally.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, to obtain a new combination of features (not explicitly recited herein) that nevertheless remains within the scope of the present invention, especially where such a new combination would provide an advantage recited in the present description and, this, notwithstanding the particular technical contexts in which the features constituting this new combination may have been described, e.g., for the mere sake of illustration, and provided that such a new combination makes sense for the one skilled in the art, in view of other elements described in the present application, such as advantages provided by the features described herein. Various combinations of the features described in respect of any of the above embodiments or variants may accordingly be contemplated, that remain within the scope of the appended claims. In addition, many minor modifications may be made to adapt a particular situation to the teachings of the present invention without departing from its scope. Therefore, it is intended that the present invention not be limited to the particular embodiments disclosed, but that the present invention will include all embodiments falling within the scope of the appended claims. In addition, many variants not explicitly depicted in the appended drawings or described can be contemplated. Notably, aspects of the first class of embodiments can be combined with aspects of the second or third class of embodiments. For example, a top electrode can be structured in-plane (to exhibit distinct portions as in FIG. 2), while being altogether transversally structured, thereby forming transversal structures that are electrically insulated from each other.

What is claimed is:

1. An electromechanical switching device, comprising:
   a first electrode, comprising layers of a first 2D layered material, which layers exhibit a first surface;
   a second electrode stacked over the first electrode, comprising layers of a second 2D layered material, which layers exhibit a first portion comprising a first surface electrically insulated from a second portion comprising a second surface by an insulating element, the first and second surfaces of the second electrode opposite the first surface of the first electrode; and
   an actuation mechanism;

wherein each of the first and second 2D layered materials has an anisotropic electrical conductivity, which is lower transversely to its layers than in-plane with the layers;

wherein at least one of the first and second electrodes is actuatable by the actuation mechanism, such that actuation thereof changes an amount of overlap between the first electrode and the second electrode for modification of an electrical conductance transverse to each of the first surface of the first electrode and the first and second surfaces of the second electrode to enable current modulation between the first electrode and the second electrode, such that a first actuation results in no overlap, a second actuation results in a partial overlap, and a third actuation results in a complete overlap;

wherein the electrical conductance transverse to the first surface of the first electrode and the first and second surfaces of the second electrode changes as a function of both the offset between the first electrode and the second electrode and a width of the insulating element.

2. The electromechanical switching device of claim 1, wherein the actuatable electrode is movable by the actuation mechanism, such that the first surface of the first electrode and the first and second surfaces of the second electrode are movable parallel to each other upon actuation by the actuation mechanism.

3. The electromechanical switching device of claim 2, wherein the second electrode is structured in-plane with the first surface of the first electrode.

4. The electromechanical switching device of claim 2, wherein the second electrode is structured transversely to the first surface of the first electrode, such as to exhibit two or more structures transversal to the first surface of the first electrode, each of the two or more transversal structures forming a distinct area.

5. The electromechanical switching device of claim 4, further comprising a third portion comprising a third surface electrically insulated from the first and second portions by a second insulating element, the third surface opposite the first surface of the first electrode.

6. The electromechanical switching device of claim 5, wherein a width of the second insulating element is different than the width of the insulating element electrically insulating the first portion from the second portion.

7. The electromechanical switching device of claim 1, wherein the first portion of the second electrode comprises a first electrical conductivity and the second portion of the second electrode comprises a second electrical conductivity.

8. The electromechanical switching device of claim 7, wherein first electrical conductivity is greater than the second electrical conductivity.

9. The electromechanical switching device of claim 1, in which one or more of the 2D layered materials comprises one of: graphene, graphitic layers, BN, $MoS_2$, $WS_2$, $MoSe_2$, $NbSe_2$, $NbS_2$, $NbTe_2$, $TaS_2$, $TaSe_2$, $TaTe_2$ or $TiSe_2$.

10. The electromechanical switching device of claim 1, in which the actuation mechanism comprises one or any combination of: an electrostatic mechanism; a piezoelectric mechanism; a thermal deformation mechanism; a material stress-induced mechanism, or a magnetic mechanism.

11. The electromechanical switching device of claim 1, wherein each of the 2D layered materials comprises a same 2D layered material.

12. A method of operating an electromechanical switching device, the method comprising:

actuating, via an actuation mechanism, at least one of a first electrode and a second electrode;

the first electrode comprising layers of a first 2D layered material, which layers exhibit a first surface;

the second electrode stacked over the first electrode and comprising layers of a second 2D layered material, which layers exhibit a first portion comprising a first surface electrically insulated from a second portion comprising a second surface by an insulating element, the first and second surfaces of the second electrode opposite the first surface of the first electrode; and wherein each of the first and second 2D layered materials has an anisotropic electrical conductivity, which is lower transversely to its layers than in-plane with the layers;

wherein actuation of at least one of the first electrode and the second electrode changes an amount of overlap between the first electrode and the second electrode for modification of an electrical conductance transverse to each of the first surface and the second surface to enable current modulation between the first electrode and the second electrode, such that a first actuation results in no overlap, a second actuation results in a partial overlap, and a third actuation results in a complete overlap;

wherein the electrical conductance transverse to the first surface of the first electrode and the first and second surfaces of the second electrode changes as a function of both the offset between the first electrode and the second electrode and a width of the insulating element.

13. The method of claim 12, wherein actuating at least one of the first electrode and the second electrode comprises moving the second electrode by the actuation mechanism such that the first surface of the first electrode and the first and second surfaces of the second electrode are moved parallel to each other.

14. The method of claim 12, wherein the second electrode is structured in-plane with the first surface of the first electrode.

15. The method of claim 12, wherein the second electrode further comprises a third portion comprising a third surface electrically insulated from the first and second portions by a second insulating element, the third surface opposite the first surface of the first electrode.

16. The method of claim 15, wherein a width of the second insulating element is different than the width of the insulating element electrically insulating the first portion from the second portion.

17. The method of claim 12, wherein the first portion of the second electrode comprises a first electrical conductivity and the second portion of the second electrode comprises a second electrical conductivity.

18. The method of claim 17, wherein first electrical conductivity is greater than the second electrical conductivity.

19. The method of claim 12, in which one or more of the 2D layered materials comprises one of: graphene, graphitic layers, BN, $MoS_2$, $WS_2$, $MoSe_2$, $NbSe_2$, $NbS_2$, $NbTe_2$, $TaS_2$, $TaSe_2$, $TaTe_2$ or $TiSe_2$.

20. The method of claim 12, wherein actuating at least one of the first electrode and the second electrode comprises one or any combination of: actuating an electrostatic mechanism; actuating a piezoelectric mechanism; actuating a thermal deformation mechanism; actuating a material stress-induced mechanism, and actuating a magnetic mechanism.

* * * * *